US012803537B2

(12) United States Patent
Mudd

(10) Patent No.: US 12,803,537 B2
(45) Date of Patent: Nov. 17, 2026

(54) POWER SWITCHING SYSTEM

(71) Applicant: digiLED (UK) Limited, Beare Green (GB)

(72) Inventor: Thomas Mudd, Beare Green (GB)

(73) Assignee: digiLED (UK) Limited (GB)

( * ) Notice: Subject to any disclaimer, the term of this patent is extended or adjusted under 35 U.S.C. 154(b) by 298 days.

(21) Appl. No.: 18/486,272

(22) Filed: Oct. 13, 2023

(65) Prior Publication Data

US 2024/0128953 A1 Apr. 18, 2024

(30) Foreign Application Priority Data

Oct. 13, 2022 (GB) ...................................... 2215149
Jun. 13, 2023 (GB) ...................................... 2308780

(51) Int. Cl.
*H02M 1/32* (2007.01)
*H03K 3/012* (2006.01)
(Continued)

(52) U.S. Cl.
CPC ........... *H03K 3/012* (2013.01); *H05B 47/155* (2020.01); *H03K 2005/00013* (2013.01); *H03K 5/01* (2013.01)

(58) Field of Classification Search
CPC ..................... H03K 3/012; H03K 5/01; H03K 2005/00013; H03K 3/00; H05B 47/155;
(Continued)

(56) References Cited

U.S. PATENT DOCUMENTS

2006/0281434 A1* 12/2006 Takami ..................... G06F 1/26 455/343.1
2014/0022685 A1 1/2014 Miao et al.
(Continued)

FOREIGN PATENT DOCUMENTS

CN 216290665 U 4/2022
WO 2013/098744 A2 7/2013

OTHER PUBLICATIONS

Search Report for corresponding British Application No. GB2215149.2 dated Dec. 12, 2022.
(Continued)

*Primary Examiner* — Shardul D Patel
(74) *Attorney, Agent, or Firm* — CHRISMAN GALLO TOCHTROP LLC

(57) ABSTRACT

A power switching system for controlling power supply to an electronic assembly comprising a plurality of electronic devices each having a power supply unit, the power switching system comprising a plurality of power switching modules, each power switching module being configured to control power supply by a respective one of the power supply units to one of the electronic devices. Each power switching module comprises a module output for connecting to the power supply unit of a respective one of the electronic devices; a control input configured to receive a control signal; and a switch configured to, following receipt of the control signal, activate an electrical connection between the module output and the respective power supply unit and thereby to cause the power supply unit to switch on power supply to at least the respective one of the plurality of electronic devices.

20 Claims, 3 Drawing Sheets

(51) Int. Cl.
*H05B 47/155* (2020.01)
*H03K 5/00* (2006.01)
*H03K 5/01* (2006.01)

(58) Field of Classification Search
CPC .. H05B 47/187; H05B 47/25; H05B 45/3725; H02M 1/36; H02M 1/007; H02M 1/32; H02H 9/001
USPC .......................................................... 700/22
See application file for complete search history.

(56) References Cited

U.S. PATENT DOCUMENTS

| | | | | |
|---|---|---|---|---|
| 2014/0369180 | A1* | 12/2014 | Shimokawa | H04L 49/40 370/255 |
| 2017/0084246 | A1* | 3/2017 | Joshi | H05B 47/155 |
| 2017/0294792 | A1 | 10/2017 | Tischer | |
| 2019/0165568 | A1* | 5/2019 | Adamski | H02H 9/001 |
| 2021/0081159 | A1* | 3/2021 | Kaneko | G06F 3/1446 |

OTHER PUBLICATIONS

Search Report for corresponding British Application No. GB2308780.2 dated Jul. 22, 2023.

International Search Report and Written Opinion for corresponding International Application No. PCT/GB2023/052655 mailed Jan. 26, 2024.

* cited by examiner

POWER SWITCHING SYSTEM

FIELD OF THE INVENTION

The present relates to a power switching module and a power switching system for controlling power supply to an electronic assembly and also to a method of controlling power supply to an electronic assembly. In particular, the present invention relates to a power switching system and a method for controlling power supply to a LED display screen.

BACKGROUND TO THE INVENTION

Electronic devices may be supplied with power using a switched-mode power supply (SMPS) which converts power from an input power source or power feed (such as an AC power source) to an output power supply suitable for the electronic device (such as a DC output of reduced voltage compared to the input). A SMPS typically includes one or more capacitors in order to store power or smooth the effect of variations (e.g. surges) in input, intermediate and output power. It is common practice and good design to ensure that said capacitors are returned to a discharged state via use of discharge circuits when the SMPS is not in use so as to provide a safe device status should electrical engineers choose to work upon the device. Accordingly, when an input power source or power feed to a SMPS is first switched on, all capacitors are typically in a discharged state, which causes an initial current surge known as an inrush current, start-up current or switch-on surge to occur whilst the capacitors charge. This inrush current may be considerably larger than a steady-state supply current to the SMPS, such that initial switching on of an electronic device connected to the SMPS causes an undesirable current spike or power surge in the power feed to the electronic assembly.

This problem is exacerbated when an apparatus or system (such as an array of electronic devices) comprises a plurality of SMPSs, since the combined inrush current of the SMPSs may result in a power surge which can cause 'tripping' or switching (sometimes called 'nuisance tripping') of circuit breakers or other devices arranged to protect circuits from excess current. One solution to this problem is to divide the apparatus or system into discrete units, each unit comprising a number of the plurality of SMPS-powered devices, and to switch on power to each of these units separately (typically manually and at a location remote to a location of the electronic devices) using heavy duty switching equipment.

Another approach to the problem of nuisance tripping is to use 'oversize' circuit breakers or other safety features which are configured to withstand inrush currents considerably larger than, for example, a steady-state operating current of the electronic assembly. However, a disadvantage of this approach is that such safety features are therefore less sensitive and so may not be triggered in a suitably safe manner by electrical faults in the electronic assembly, which can lead to power feed(s) to the electronic assembly remaining live even in the event of serious failure or fire.

LED display screens (electronic assemblies which may also be known as LED video screens, LED video walls, or Direct View LED (DVLED) screens) may include a plurality of modular LED panels arranged such that the display screen displays messaging, image and video content as if it were a single screen. Each LED panel may comprise a plurality of LED tiles. A LED screen typically comprises controller cards which manage data transmission to a plurality of driver integrated circuits (ICs) of each LED panel. Each driver IC then regulates current to LED pixels of the LED panel in order to display the required image. Generally, power supply to each LED panel is controlled by a SMPS which regulates voltage and current supplied to components in each panel. Therefore, a LED display screen may comprise a plurality of SMPSs, which may cause an undesirable inrush current when the LED display screen is switched on. For this reason, power feeds to LED displays are seldom switched off, since switching them on again can lead to nuisance tripping and the need to reset (often manually and often repeatedly) a power feed/source or power subsystem feeding an area of the screen.

In practice, to imitate 'switching off' a LED display screen, typically a dark or black image or video is displayed on the screen to give the appearance that the screen has been turned off, whilst in fact the screen has not been switched off and continues to consume power. This approach is used where display screens are required to be disabled, for example to comply with light pollution, urban planning or advertising regulations. A LED display screen displaying a black image may consume up to 20% of the maximum power used when displaying a colour image or video. Therefore, because power feeds to display screens are generally left on, considerable unnecessary power consumption may occur, which can be economically and environmentally costly.

It is an object of the present invention to overcome at least one problem associated with the prior art, whether referred to herein or otherwise.

SUMMARY OF THE INVENTION

According to a first aspect of the invention there is provided a power switching system for controlling power supply to an electronic assembly comprising a plurality of electronic devices each having a power supply unit, the power switching system comprising a plurality of power switching modules, each power switching module being configured to control power supply by a respective one of the power supply units to one of the electronic devices and each power switching module comprising:

- a module output for connecting to the power supply unit of a respective one of the electronic devices;
- a control input configured to receive a control signal; and
- a switch configured to, following receipt of the control signal, activate an electrical connection between the module output and the respective power supply unit and thereby to cause the power supply unit to switch on power to at least the respective one of the plurality of electronic devices;

the power switching system further comprising a delay module configured to initiate a time delay for each power switching module and wherein each power switching module is configured to operate the switch once the time delay has lapsed;

wherein at least two of the time delays are of different durations, such that a duration of the time delay is different for at least two of the power switching modules; and wherein the durations of at least two of the time delays are independent of each other.

With this arrangement, the power switching system is configured to limit a maximum startup current in the main power source, the maximum startup current comprising the sum of individual startup currents to each of the power supply units at any time.

Preferably the durations of at least two of the time delays are independent of each other. Preferably the durations of all of the time delays are independent of one another. Preferably the duration of each time delay is independent and/or unrelated to the duration of each of the other time delays. Preferably the duration of each time delay is independent from and/or unrelated to a characteristic of the respective power switching module and/or a respective electronic device in the power switching system. For example, preferably the duration of each time delay is independent from and/or unrelated to a position of the respective power switching module in the power switching system. The duration of each time delay may be independent from and/or unrelated to an individual identifier, location and/or function of the respective power switching module and/or a respective electronic device in the power switching system.

Preferably each power switching module comprises a module power input for connecting to a main power source of the electronic assembly and the module output comprises a module power output and preferably the switch is configured to connect the module power input to the module power output for supplying power to the respective power supply unit. In this case, the switch activates the electrical connection by switching on power supply to the power supply unit.

In other embodiments the switch and/or module output of each power switching module may be configured to send a secondary control signal to the respective power supply unit to cause the power supply unit to supply power to the at least one electronic device. In this case, activating the electrical connection comprises sending the secondary control signal (rather than switching on power supply to the power supply unit). In such examples, each power supply unit may be (directly) connected to a main power source of the electronic assembly and the secondary signal (trigger signal) may cause activation of the power supply unit to supply power to the electronic device. For example, the secondary control signal may cause the power supply unit to switch from a ‘standby’ or ‘sleep’ mode of operation (in which power is not supplied to the electronic device) to an active or ‘awake’ mode in which power is supplied to the electronic device. In such examples, each power switching module need not be connected to the main power source or power feed of the electronic assembly.

Preferably each power switching module comprises a delay module configured to initiate, upon receipt of the control signal by the control input, a time delay and the delay module is configured to operate the switch once the time delay has lapsed; wherein at least two of the delay modules of the plurality of power switching modules are configured to initiate time delays of different durations, such that a duration of the time delay is different for at least two of the power switching modules. Preferably, each delay module is configured to initiate a time delay of different duration to a time delay initiated by any of the other delay modules. Preferably a time delay in each power switching module is initiated at substantially the same time.

In some embodiments a plurality of the power switching modules are connected to a single delay module and the delay module is configured to initiate a time delay for each power switching module to which it is connected and to transmit a control signal to each power switching module upon lapse of each time delay, to cause the power switching module to operate the switch. With this arrangement, control signals are sent to the power switching modules at different times. In such embodiments the delay module may be a single, central delay module (or hub) to which each power switching module is connected. Preferably each of the time delays initiated by the delay module is of a different duration.

Preferably the or each delay module comprises a random time delay module configured to initiate a time delay of random duration.

Preferably the time delay module is a digital time delay module. Preferably the time delay module comprises a microcontroller unit (MCU).

The time delay module may comprise an analogue time delay module. In this case the time delay module may comprise analogue time-delay circuitry in which a time-delay is generated by the time taken for a threshold voltage or current to be reached.

Preferably at least one of the delay modules comprises a random time delay module configured to initiate, upon receiving the control signal, a time delay of random duration and configured to operate the switch when the (random) time delay has lapsed. The random time delay module may comprise a pseudorandom number generator for generating the duration of the random time delay. Alternatively, analogue components such as resistors, capacitors or inductors may be used to create analogue voltage or current threshold-derived time delays. For example, the time delay module may comprise analogue time-delay circuitry (such as a resistor-capacitor circuit) in which a time delay is generated by the time taken for a threshold voltage or current to be reached. In such examples, inherent variability in the properties of the components may provide random differences in the duration of time delays between different power switching modules. For instance, inaccuracies in the precise values of resistance, capacitance, or inductance values of components and/or other variations in a time delay inherent to each analogue circuit may be used to introduce the randomness of variations from device to device.

With these arrangements, the time delay for each power switching module is different, so that a maximum current in the main power source is minimised. The system is conveniently scalable, because with a random duration of time delay, there is no need to compare the time delay of any one power switching module with any other power switching modules in the system (for example when adding modules to increase the size of the system). Preferably the duration of each delay is unrelated to the number of modules in the system.

Preferably a duration of each time delay is from 0 to 60 seconds after receipt of the control signal, more preferably from 1 to 30 seconds, even more preferably from 5 to 15 seconds. For example 5 to 15 seconds after receipt of the control signal. With this arrangement, the total time taken for all of the power switching modules to switch on power to their respective electronic devices may be substantially constant irrespective of the number of modules in the system. The duration of each time delay may be at least 0.5 seconds, at least 1 second, at least 2 seconds, at least 3 seconds, or at least 4 seconds.

Preferably each power switching module is connected to a common control line such that each power switching module receives the control signal at substantially the same time. Preferably the power switching system is configured such that a single control signal causes power to be switched on to all of the power supply units. Preferably each power switching module is connected to a common control signal source such that a single control signal causes each power switching module to operate the switch. In this way the electronic assembly can switched on with a single action such as pushing a trigger button or switching a web relay, without the need for multiple actions such as operating multiple switches.

Preferably the power switching system comprises a control line. Preferably the control signal is transmitted via a control line. Preferably the control line comprises a wired connection. Preferably the control line comprises a twisted pair cable. Preferably the control line comprises an Ethernet cable. Preferably the control signal is transmitted via a power-over-Ethernet connection. The power-over-ethernet (PoE) connection may comprise, for example, Cat5e, Cat6, or Cat8 twisted pair cable (or other twisted pair cable) which may sometimes be referred to as 'Ethernet' cable.

Preferably, each of the power switching modules is connected to another of the power switching modules by a control line. Preferably at least one of the power switching modules comprises a control output for connecting to the control input of another of the power switching modules for transmitting the control signal between the power switching modules. In such embodiments the control signal may be transmitted between adjacent power switching modules. Preferably the power switching modules are connected in a daisy chain arrangement. The power switching system may comprise the control line.

The control signal may be transmitted by means for transmitting data to the electronic assembly. The control signal may be transmitted with data to the electronic assembly. For example, the control signal may be transmitted over a data cable to the electronic assembly. Where the electronic assembly comprises a LED display screen, the control signal may be transmitted with, and/or by the same means by which image and/or video data is transmitted to the LED display screen.

The control signal may be transmitted from a control signal source. The power switching system may comprise the control signal source. The control signal source may comprise a web relay. The control signal source may comprise a control-over-IP device or system. The control signal source may comprise a manual push button trigger, or a switch (such as a dry contact closure). The control signal source may be a remote control signal source.

At least one of the power switching modules may comprise a zero-crossing solid state relay configured to control power supply to the module power outlet. The switch may comprise the zero-crossing solid state relay. With these arrangements, when the switch is operated, a maximum current (e.g. inrush current) is limited by the zero-crossing solid state relay.

At least one of the power switching modules may comprise a negative temperature coefficient (NTC) thermistor configured to control power supply to the module power output. In this case when the switch is operated, a maximum current (e.g. inrush current) is, at least in part, limited by the NTC thermistor.

The power switching system may comprise the electronic assembly. The electronic assembly may comprise a light-emitting diode (LED) display screen. The plurality of electronic devices may comprise a plurality of LED panels. Each power supply unit may comprise a switched-mode power supply.

Preferably a power switching module is connected to each power supply unit. Preferably (only) a single power switching module is connected to each power supply unit. A power switching module may be mounted to each electronic device. Where the electronic assembly is a LED display screen, a power switching module may be mounted to each LED panel.

The electronic assembly may comprise a lighting system and each of the plurality of electronic devices may comprise a light or light module. For example the system of the present invention may be used to control power supply to lights in a lighting system of a building, or to a system of lights such as floodlights.

The electronic assembly may comprise an information technology (IT) or telecommunications system and each of the plurality of electronic devices may comprise an IT or telecommunications device or IT or telecommunications module. For example, the system of the present invention may be used to control power supply to servers in an IT system of a building, or to a system of IT equipment such as a server farm, or, in another example, to control power supply to a system of audio-visual and communications equipment in an outside broadcast vehicle.

Each power switching module may be connected to more than one power supply unit. Each power supply unit may be configured to control power supply to a plurality of power supply units. For example, the plurality of electronic devices may comprise groups of electronic devices and each power switching module may be connected to each electronic device within one of the groups.

In some embodiments the power switching system is also suitable for controlling power supply to an electrical assembly comprising a plurality of electrical devices. For example, the power switching system may be used to control power supply to a plurality of lights, heating devices, motors and the like. The power switching system may comprise the electrical assembly.

According to a second aspect of the invention there is a provided a power switching module for use in the power switching system of the first aspect. The power switching module may be in the form of a board or card.

According to a third aspect of the invention there is provided a method of controlling power supply to an electronic assembly comprising a plurality of electronic devices each having a power supply unit, the method comprising:

- providing a plurality of power switching modules, each power switching module being configured to control power supply by a respective one of the power supply units to one of the electronic devices;
- initiating at a delay module, a time delay for each power switching module, wherein each power switching module is configured, upon lapse of the time delay, to operate a switch to activate an electrical connection between the power switching module and the respective power supply unit and thereby to cause the power supply unit to switch on power supply to at least the respective one of the plurality of electronic devices;
- wherein at least two of the time delays are of different durations, such that a duration of the time delay is different for at least two of the power switching modules.

Preferably each power switching module comprises a delay module configured to initiate, upon receipt of a control signal by the control input, a time delay and the delay module being configured to operate the switch once the time delay has lapsed; wherein at least two of the delay modules of the plurality of power switching modules are configured to initiate time delays of different durations, such that a duration of the time delay is different for at least two of the power switching modules.

In some embodiments a plurality of the power switching modules is connected to a single delay module and the delay module is configured to initiate a time delay for each power switching module to which it is connected and to transmit a control signal to each power switching module upon lapse of each time delay, to cause the power switching module to operate the switch.

Preferably the duration of each time delay is random.

The method may comprise retrofitting the power switching modules to an existing electronic assembly.

According to another aspect of the present invention there is provided a power switching system for controlling power supply to an electronic assembly comprising a plurality of electronic devices each having a power supply unit, the power switching system comprising a plurality of power switching modules, each power switching module being configured to control power supply to a respective one of the power supply units and each power switching module comprising:

- a module power input for connecting to a main power source of the electronic assembly;
- a module power output for connecting to the power supply unit of a respective electronic device;
- a control input configured to receive a control signal;
- a switch for connecting the module power input to the module power output for supplying power to the respective power supply unit;
- a start module configured to operate the switch upon receipt of the control signal by the control input; and
- a start element configured to limit an initial current drawn by the respective power supply unit when the switch is operated.

The start element may comprise a zero-crossing solid state relay. The start element may comprise a NTC thermistor.

BRIEF DESCRIPTION OF THE DRAWINGS

The present invention will now be described, by way of example only, with reference to the accompanying drawings, in which like reference numerals are used for like features and in which.

DESCRIPTION OF THE PREFERRED EMBODIMENTS

The present invention provides a power switching system and power switching module for use in the power switching system. In use, a plurality of the power switching modules are arranged to provide the power switching system. Each power switching module is arranged to control power supply by a power supply unit such as a switched-mode power supply (SMPS). In particular, the power switching module may be arranged to switch power supply to a power supply unit (such as a LED driver unit) of a LED panel. The power switching system comprising a plurality of the power switching modules may be used to supply power to a plurality of LED panels forming part of a LED display screen. In this arrangement, a power switching module is connected to a power supply unit of each of the LED panels, to control power supply to each LED panel. Each power switching module is arranged to switch on power to (or from) a respective LED panel power supply unit when the power switching module receives a controls signal.

Figure 1:
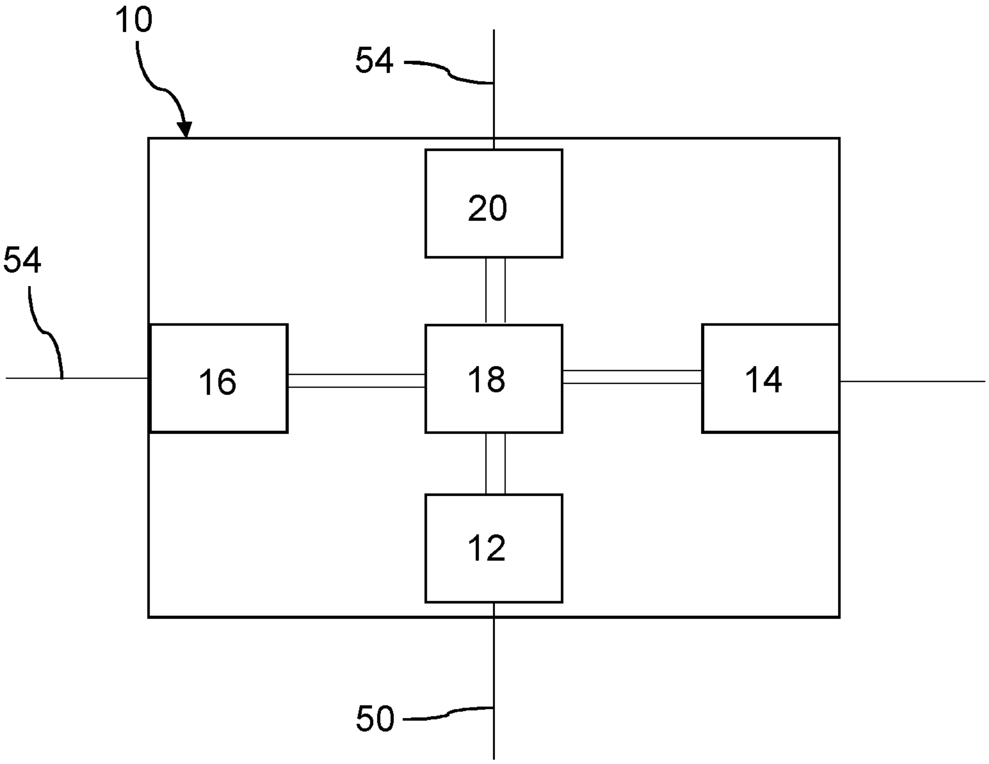
FIG. 1 is schematic view of a power switching module according to a preferred embodiment of the present invention.

FIG. 1 shows a power switching module 10 according to a preferred embodiment of the present invention. The power switching module 10 comprises a power input 12, a power output 14, a control input 16, and a start module 18.

In this embodiment, the power switching module 10 comprises a board 10 which comprises the power input 12, power output 14, control input 16, and start module 18. The power input 12 is arranged to be connected to an input power source 50, such as a mains power source or other external power source. The power output 14 is arranged to be connected to a device to which electrical power is to be supplied, such as a power supply unit (e.g. a SMPS) of an electronic device. The control input 16 is arranged to be connected to a control signal source 52 for receiving a control signal or trigger signal. The control input may be connected to the control signal source by a control line 54. In this embodiment, the control input 16 comprises an Ethernet connector.

The control signal source may be a control device (not shown in FIG. 1) which may be located remotely to the power switching module, as described further below. In the present embodiment, the control signal is transmitted over a control line 54 in the form of a power over Ethernet (PoE) connection 54. The switching module 10 of the present embodiment further comprises a control output 20 for transmitting or relaying the control signal to another power switching module 10. The control output is configured to be connected to a control input of another power switching module 10, for example by another control line 54. In some embodiments, the control output is not present.

The start module 18 comprises a switch (not shown). The start module 18 is arranged to switch a connection between the power input 12 and the power output 14 so that power supply to the power supply unit is connected or disconnected. In this embodiment the start module 18 comprises a delay module. The switch is configured to switchably connect the power input 12 to the power output 14. The start module 18 is configured to receive the control signal from the control input 16. The start module 18 is configured, upon receipt of the control signal, to operate the switch. The start module 18 is arranged to operate the switch to connect the power input 12 to the power output 14 (e.g. so that the switch is "on"). The start module 18 is also arranged to operate the switch to disconnect the power input from the power output (e.g. so that the switch is "off"). The switch may comprise any suitable means for switching power to the power output on and off, such as a relay.

In the present embodiment, the start module 18 comprises a random delay timer (delay module) and a switch (not shown). The random delay timer is configured, when triggered by the control signal, to operate the switch to connect (or disconnect) the power input 12 and power output 14. The random delay timer is configured to operate or trigger the switch to connect the power input 12 and output 14 after a time delay of random length. In this embodiment, a duration of the time delay is limited to from 5 to 15 seconds after the control signal is received. The random delay timer generates a random time delay each time the control signal is received. In this embodiment the delay timer is implemented by a microcontroller unit (MCU) configured to call up a random value. In this way, the length of time between receipt of the control signal and switching on power to the power output 14 (and thus to a connected power supply unit) is different substantially every time the control signal is received. With this arrangement, as described further below, where a plurality of power switching modules 10 is provided in a power switching system 100, following receipt of the control signal (which may occur substantially simultaneously at each power switching module) each power switching module 10 switches on power to its respective power output 14 at different times. In this way, a large initial current flow through an input power supply or main power supply 50 which powers the power switching system 100 can be avoided. In this embodiment, the duration of each time delay is set to a minimum of 5 seconds from receipt of the control signal, which helps to ensure that the MCU has enough time to complete booting and to reach a steady state before the time delay is complete. It will be appreciated that in some embodiments, the minimum time delay may be less than 5 seconds, or less than 1 second, or there may be no minimum time delay (e.g. the duration of the time-delay may be zero).

In other embodiments, the start module comprises analogue time-delay circuitry in which a time delay is generated by the time taken for a threshold voltage or current to be reached. For example, a resistor-capacitor circuit may be configured to, upon receipt of the control signal, generate a time delay by charging a capacitor until a threshold voltage is reached, and to operate the switch upon completion of the time delay. In such examples, inherent variability in the properties of the components may provide random differences in the duration of time delays between different power switching modules, so that each power switching module switches on power to its respective power supply unit at different times.

In some embodiments the power switching module comprises a control module configured to receive the control signal and to operate the start module in response to the control signal. In this case, the control module is connected to the control input. The control module may comprise a relay and/or one or more microprocessors. The control module may process the control signal to determine properties of the control signal. For example the control module may determine whether the control signal is an activating "on" signal or a deactivating "off" signal. The control module is connected to the start module and is arranged to operate or trigger the start module upon receipt of the control signal. In some embodiments, the control module may be integral with the start module, and/or the control module may comprise the start module.

Figure 2:
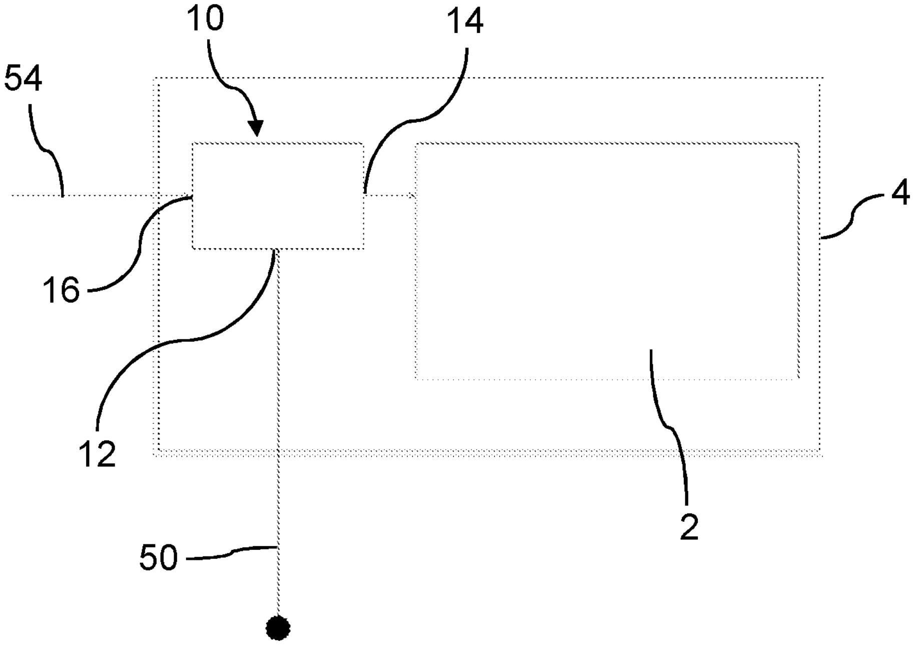
FIG. 2 is schematic view of an assembly comprising the power switching module of FIG. 1, together with a LED panel and a power supply unit with which the power switching module may be used.

FIG. 2 shows the power switching module 10 together with a power supply unit 2 to which the module 10 may be connected. The power supply unit 2 is a SMPS which is arranged to control power supply to an electronic device, which in this embodiment is a LED panel 4. The power input 12 is connected to a mains power supply 50 which supplies power to the LED panel 4. The power output 14 is connected to the power supply unit 2 of the LED panel 4. The control input 16 is connected to a control signal source by a control line 54. In this embodiment, the control line is a PoE connection 54. Also in this embodiment, the control signal source 52 (not shown in FIG. 2) is located remotely from the power switching module 10. For example, the control signal source 52 may be located in a control room remote from the switching module 10 and connected power supply unit 2.

Figure 3:
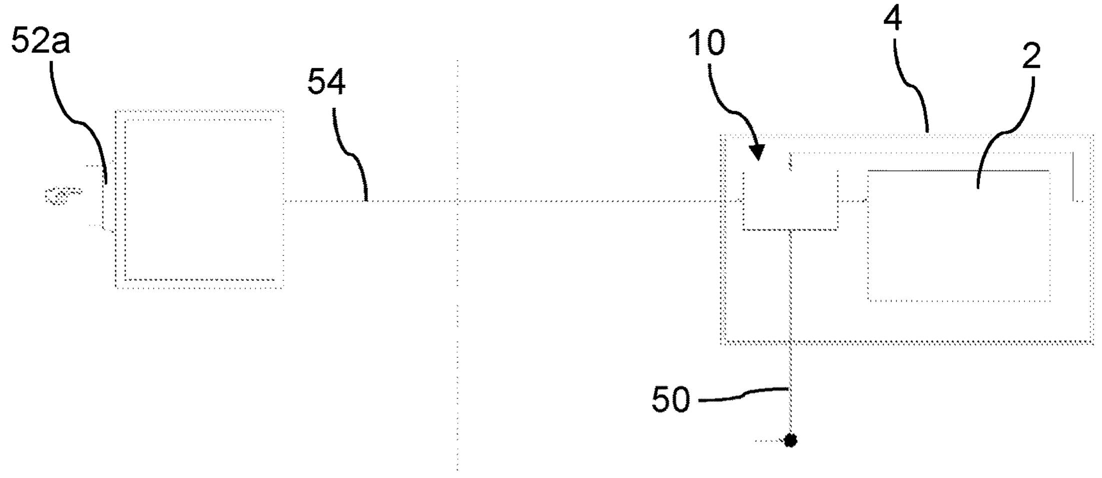
FIG. 3 is a schematic view of the assembly of FIG. 2, in which a control input of the power switching module is connected by a control line to a control signal source comprising a manual push button.
Figure 4:
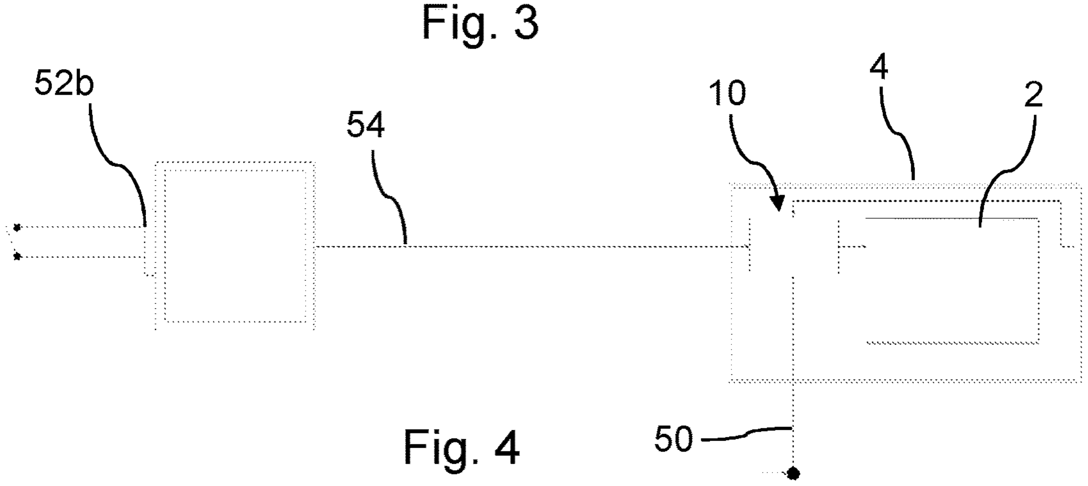
FIG. 4 is a schematic view of the assembly of FIG. 2, in which a control input of the power switching module is connected by a control line to a control signal source comprising a dry contact switch.
Figure 5:
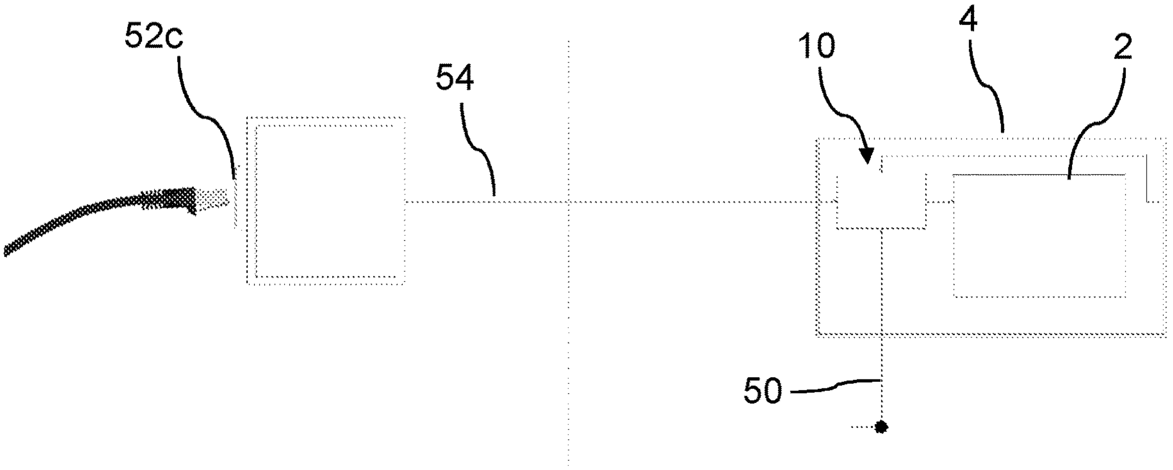
FIG. 5 is a schematic view of the assembly of FIG. 2, in which a control input of the power switching module is connected by a control line to a control signal source comprising a control-over-IP system.

Referring additionally to FIGS. 3, 4 and 5, the control signal source 52 may comprise a manual push button trigger 52*a*, a switch such as a dry contact closure 52*b*, or may be implemented by a control-over-IP (internet protocol) system 52*c*. It will be appreciated that other suitable control signal sources may be used. Where IP control is used, the control signal may be triggered or controlled using a web-based interface or a web relay. The control signal may be triggered using a web application, and/or using an application on a remote device such as smartphone or tablet. In the present embodiment, the control signal source comprises an IP control system or IP control element 52*c*. With this arrangement, a control signal may, for example, be sent from any device connected to the same network as the control signal source 52.

In this embodiment the control signal or trigger signal is provided as a signal transmitted by PoE (for example 48 V PoE). In other embodiments, the control signal may comprise a DC signal (e.g. 50 V DC), or relatively low voltage trigger signal, such as a 12V or 5 V signal.

In the embodiments described above, the input power source 50 (e.g. mains power supply) can remain switched on at all times, and switching of power to the LED panel power supply unit 2 occurs in the power switching module 10. In this way, the input power source 50 need not be switched on and off, which may avoid having to manually operate switches or, in higher power applications, switchgear.

Figure 6:
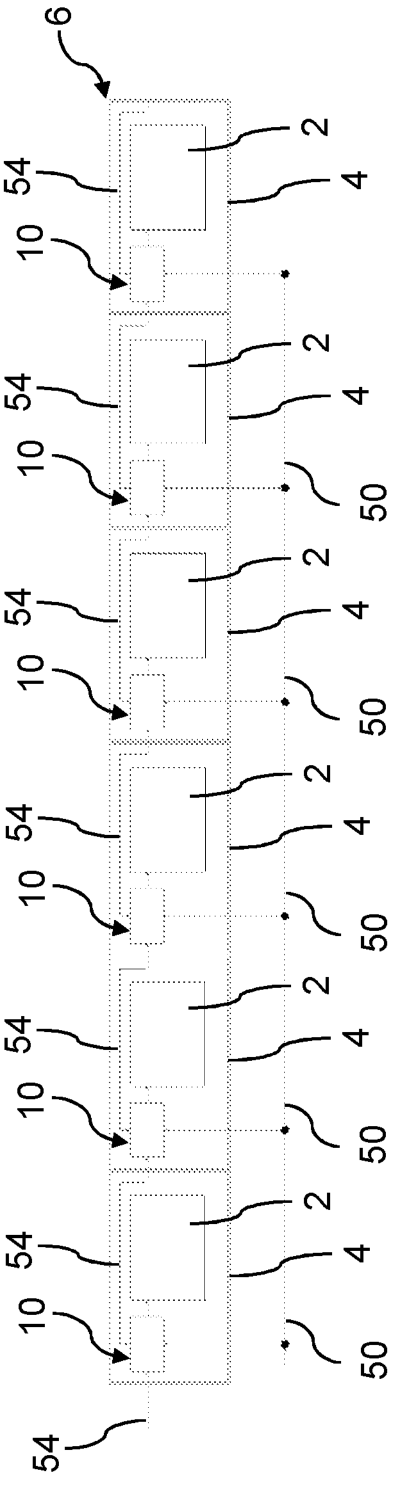
FIG. 6 is a schematic view of a power switching system according to a preferred embodiment of the invention in use connected to a LED display screen comprising a plurality of LED display panels.

Referring now to FIG. 6, the power switching module 10 can be used to provide a power switching system 100 comprising a plurality of power switching modules 10. The power switching system 100 can be used to control power supply to a plurality of power supply units 2 (e.g. a plurality of SMPSs) in a large and/or complex apparatus such as an array of electronic devices.

In the present embodiment, the power switching system 100 is used to control power supply to a LED display screen 6 comprising a plurality of modular LED panels 4 arranged in an array. Each LED panel 4 comprises a power supply unit 2 (e.g. a LED driver unit) which controls voltage supplied to the LED panel 4. An input power supply 50 is provided to supply power to each LED panel 4 in the LED display screen 6.

The power switching system 100 comprises a plurality of power switching modules 10. In this embodiment a power switching module 10 is provided for each LED panel 4. As can be seen in FIG. 6, each power switching module 10 is connected to the input power supply 50. The power output 14 of each switching module 10 is connected to the power supply unit 2 of the respective LED panel 4 to which the module 10 is connected. The control input 16 of each switching module 10 is connected (directly or indirectly) to a control signal source 52. In this embodiment, a control input 16*a* of a first power switching module 10*a* of the plurality of power switching modules is connected to the control line 54. The control line 54 is arranged to carry control signals from a remote location. The control output 14*a* of the first switching module 10*a* is connected to the control input 16*b* of a second power switching module 10*b* of the plurality of power switching modules 100. The control output 14*b* of the second power switching module 10*b* is connected to the control input 16*c* of a third power switching module 10*c*, and so on.

In this way, the switching system 100 comprises a control signal 'daisy chain' which enables the control signal to be communicated to all of the switching modules 10. The daisy chain arrangement provides a modular system of power switching modules 100. The system is thus conveniently scalable and modules 100 can be added or removed to alter the size of the power switching system 100. The modules may be connected in a parallel bus arrangement. These control signal connections between power switching modules 10 may be made using a suitable wired connection (such as an Ethernet cable or other twisted pair cable). In other embodiments, the switching modules 10 need not be 'daisy-chained', but, for example, each module 10 could be directly connected to the control line, or the system could comprise a hub or branched connection from which the control signal could be distributed to each module 10 individually.

In the present embodiment, a control signal transmitted along the control line 54 is received by each power switching module 10 at substantially the same time. When each start module 18 receives the control signal, the random delay timer generates or calls up a random time delay. In this embodiment the random time delay has a duration from 5 to 15 seconds. Once the time delay has elapsed, the start module 18 of each switching module 10 operates the switch to connect the power input 12 to the power output 14 in order to switch on power to the power supply unit 2. With this arrangement a single control signal may be used to trigger switching on power to all the LED panels.

It will be appreciated that, since the time delay generated by each start module 18 is random, the duration of the time delay for each power switching module 10 is different and is independent of the duration of each other time delay. Accordingly, each power switching module 10 switches on power to its respective power supply unit 2 at a different time. Each LED panel 4 is therefore switched on at a different time. With this arrangement, inrush currents associated with switching on each power supply unit 2 occur at different times (e.g. are staggered), so that the maximum combined current draw at any one time is considerably less than if power was switched on to all the power supply units 2 simultaneously. In this way, the combined effect of the plurality of time delays provides a 'soft start' which limits a maximum current draw from the input power supply 50, thus greatly reducing the chances of tripping a circuit breaker or other safety feature connected to the input power supply 50. Accordingly, the power switching system 100 comprises a soft start arrangement. In particular, in this embodiment, the soft start arrangement comprises the plurality of start modules (delay modules).

Figure 7:
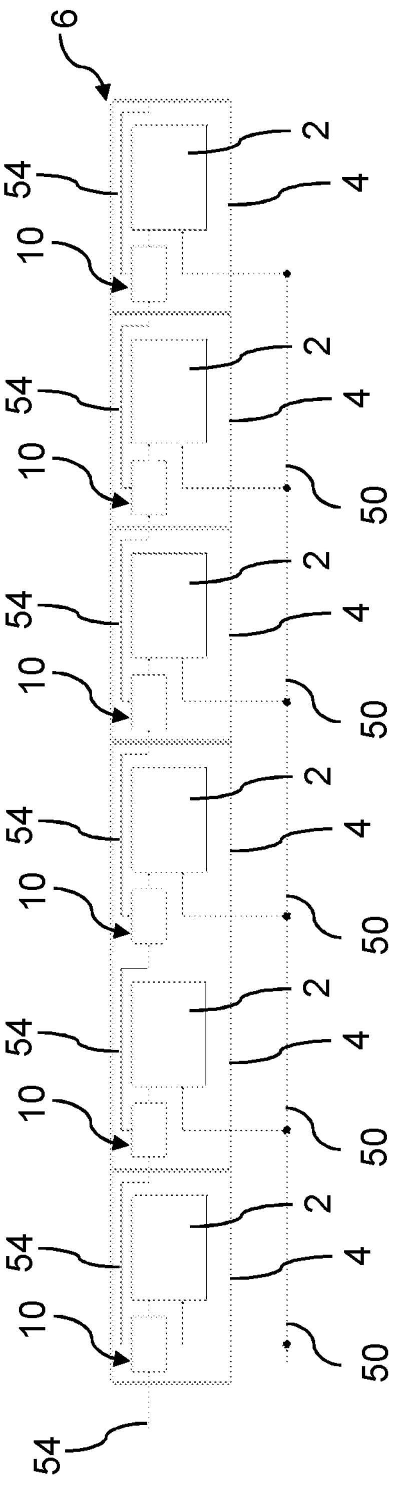
FIG. 7 is a schematic view of a variant of the power switching system of FIG. 6.

In a variant or alternative arrangement of the power switching system 100, shown in FIG. 7, the main power supply 50 is not directly connected to each power switching module 10. Instead, the power supply 50 is connected to each power supply unit 2 and each power switching module 10 is connected to its respective power supply unit 2 so that the power switching unit is connected to the main power supply 50 via the power supply unit 2. Otherwise, the variant of the system 100 shown in FIG. 7 is substantially identical to the system 100 described above and illustrated in FIG. 6.

In the embodiments described above, the control signal is transmitted over a control line 54 in the form of a wired PoE connection. However, the control signal may be transmitted to the or each power switching module, and/or between power switching modules, by any suitable means. In some embodiments, the control signal may be sent via the same cable through which image data (e.g. video) is sent to the LED display screen. The trigger signal may be combined with a video data signal being transmitted to the display screen. The or each control line may comprise a twisted pair cable and the control signal may be transmitted using any suitable protocol. For example, the control signal and/or image data may be transmitted using senders and/or protocols as manufactured by Novastar, Brompton, Linsn, Colorlite and others.

It will be appreciated that, in the embodiments described above, although a main power supply 50 to the LED display screen or panel can remain switched on, the or each power supply unit 2 is disconnected from the power supply 50 by the switch in the start module 18, and so the or each power supply unit 2 consumes no power when the switch is not switched on (i.e. until a suitable control signal is received). Advantageously therefore, the power consumption of a LED display screen 6 can be zero, (and the main power supply 50 may optionally be switched off) when the LED display screen 6 is not in use.

In some embodiments, the power switching system comprises a single, central delay module connected to each of the power switching modules. In this case each power switching module optionally does not comprise a delay module, but is otherwise substantially identical to the power switching modules described above. In such embodiments, the delay module is configured to initiate a time delay for each respective power switching module to which the delay module is connected. Once the time delay for a particular power switching module has lapsed, the delay module sends a control signal to the respective power switching module, causing the power switching module to operate its switch to supply power to the respective power supply unit to which the module is connected. The delay module initiates the time delays upon receipt of a control signal (for example from a control signal source such as the control signal sources described above). In a preferred embodiment, the time delays initiated by the delay module are random, so that each connected switching module receives a control signal at a different, random time. The time delays may be initiated simultaneously and be of random duration, and/or may be initiated at random times. In either case, the delay module is configured to send a control signal to each connected power switching module at a different time, so that each module receives a control signal at a different time and so power is switched on to each power supply unit at different times. The delay module is connected to each power switching module by a suitable control line, such as the control lines described above.

It will be appreciated that the time delay need not be of a random duration. Accordingly, in some embodiments the time delay initiated by the delay module, or the delay module in each switching module, may be the same each time a control signal is received. In such embodiments, to provide the staggered start or soft start arrangement, the time delay module in at least some of the switching modules may be set to predetermined durations different to the durations of delay modules of some other of the switching modules in a power switching system. In this way, the switches are operated at least at two different times following receipt of the control signal, so as to reduce the total inrush current. Preferably in such embodiments a majority or all of the delay modules may be configured to have different delay times. In these embodiments, the delay times may be preselected and compared for each switching module to avoid simultaneous switching of the switching modules to any extent likely to cause tripping.

It will be appreciated however, that in embodiments of the system in which the or each delay module has a random delay timer, the system is conveniently assembled and scalable without the need to check or compare the time delays of individual modules (or the time delays initiated by a central module). Because each time delay is random, the probability of two switches being operated simultaneously (or close together enough in time to cause a combined inrush current) is relatively low (compared to for example a system which is assembled by combining modules each having one of a few different predetermined time delays such that some may have the same time delay). A random time delay also avoids the need to check and/or compare the time delays of the modules to avoid simultaneous switching when assembling a power switching system. Also, with a random time delay, the probability is increasingly lower that, for example, three, four or more switches will be operated simultaneously. Accordingly, a plurality of random time delay switching modules can be used conveniently in a power switching system without the need for careful pre-selection or comparison of delay times between modules whilst maintaining a lower risk of simultaneous inrush currents.

In some embodiments, the power switching system comprises at least one thermal cut-off element or thermal protection element such as a thermostatically controlled switch or a thermal fuse or pyro-fuse. Each power switching module may comprise a thermal cut-off element. In the event of a fire or other increase in temperature resulting from, for example, failure of part of the LED display, a power supply to the or each LED panel or to the entire LED display screen may be cut off if the or each thermal cut-off element is triggered. In this way, power supply to the LED display screen may be shut off, for instance in the event of an electrical fault, fire or other event resulting in an increase in temperature, without necessarily being triggered by an excessive current.

In other embodiments of the present invention, each power switching module may comprise a start element or soft start element. For example, the start module may comprise a soft start component or soft start element. In such embodiments, the or each power switching module is configured individually to provide a soft start when switching on power to a power supply unit. In this way, a single power switching module may limit a maximum current draw (e.g. inrush current) by the power supply unit when the switch is operated. A start element may be provided in combination with a time delay module, or without a time delay module.

For example, in some embodiments the soft start element may comprise a negative temperature coefficient (NTC) thermistor connected in circuit with the power output.

Accordingly, when the power switching module receives a control signal and the switch is operated to supply power to the power outlet, the resistance of the NTC thermistor is initially relatively high and so limits the initial current flow into the power supply unit. The temperature of the thermistor increases as current flows through it, and so the resistance of the thermistor is reduced (relative to when the switch is first operated and an initial current flows through the thermistor). With this arrangement, the power switching module may prevent a potentially undesirable level of inrush current into the power supply unit (e.g. SMPS).

In some embodiments, the soft start element may comprise a zero-crossing solid-state relay. In such embodiments, following receipt of a control signal the or each power switching module is configured to switch on power to the or each power supply unit only when an alternating current connected to the switch has an amplitude of zero. Such embodiments may be used with an AC main power supply and/or may comprise an inverter to provide the AC. Since the amplitude of the current is at zero when power is connected to the power output, the initial current which can be drawn by the power supply unit is limited.

In such embodiments having a soft start element, when a plurality of such power switching modules are assembled to form a power switching system (e.g. as described above) the combined effect of the plurality of soft start elements is such that a total initial current draw upon switching on power to a plurality of power supply units is reduced, to help prevent tripping and the like.

In some embodiments the power switching module of the present invention is arranged to be retrofitted to existing assemblies or apparatus such as existing LED display screens. In this way, once the power switching modules have been fitted, a conventional main power supply of the LED display screen can be left switched on continuously, and switching of power supply to the LED display screen can be controlled by the power switching modules.

The power switching module and system of the present invention provide the advantage that a main power feed to a modular electronic assembly such as a LED display screen can remain switched on, but power consumption of the electronic assembly can be fully switched off (i.e. reduced to zero) by the switching action of the power switching modules when the electronic assembly is not in use. It will be appreciated that, because the action of switching on or off power supply occurs in or at the location of the electronic assembly, the need to switch on or off a main power feed (perhaps from a location remote to the electronic assembly) may be avoided. Power supply to the electronic devices of the electronic assembly can be switched on and off without resulting in an inrush current large enough to cause tripping of safety devices. Similarly, in the event of a power outage, or emergency or maintenance situation requiring the main power supply to be switched off, the LED display screen can be switched back on again without causing problems associated with a large combined inrush current.

The invention claimed is:

1. A power switching system for controlling power supply to an electronic assembly comprising a plurality of electronic devices each having a power supply unit, the power switching system comprising a plurality of power switching modules, each power switching module being configured to control power supply by a respective one of the power supply units to one of the electronic devices and each power switching module comprising:

a module output for connecting to the power supply unit of a respective one of the electronic devices;

a control input configured to receive a control signal; and a switch configured to, following receipt of the control signal, activate an electrical connection between the module output and the respective power supply unit and thereby to cause the power supply unit to switch on power supply to at least the respective one of the plurality of electronic devices;

the power switching system further comprising at least one delay module configured to initiate a time delay for each power switching module and wherein each power switching module is configured to operate the switch once the time delay has lapsed;

wherein at least two of the time delays are of different durations, such that a duration of the time delay is different for at least two of the power switching modules; and wherein the durations of at least two of the time delays are independent of each other.

2. The power switching system according to claim 1, in which each power switching module comprises a module power input for connecting to a main power source of the electronic assembly and the module output comprises a module power output and wherein the switch is configured to connect the module power input to the module power output for supplying power to the respective power supply unit.

3. The power switching system according to claim 1, in which each power switching module comprises a delay module configured to initiate, upon receipt of the control signal by the control input, a time delay and the delay module being configured to operate the switch once the time delay has lapsed;

wherein at least two of the delay modules of the plurality of power switching modules are configured to initiate time delays of different durations, such that a duration of the time delay is different for at least two of the power switching modules.

4. The power switching system according to claim 3, comprising a plurality of delay modules, in which each delay module is configured to initiate a time delay of different duration to a time delay initiated by any of the other delay modules.

5. The power switching system according claim 1, in which a plurality of the power switching modules are connected to a single delay module and the delay module is configured to initiate a time delay for each power switching module to which it is connected and to transmit a control signal to each power switching module upon lapse of each time delay, to cause the power switching module to operate the switch.

6. The power switching system according to claim 5, in which each of the time delays initiated by the delay module is of a different duration.

7. The power switching system according to claim 1, in which the or each delay module comprises a random time delay module configured to initiate a time delay of random duration.

8. The power switching system according to claim 1, comprising a control line and in which the control signal is transmitted via the control line.

9. The power switching system according to claim 3, in which each power switching module is connected to a common control signal source such that a single control signal causes each power switching module to operate the switch, or in which each power switching module is connected to a common control line such that each power switching module receives the control signal at substantially the same time.

10. The power switching system according to claim 8 in which the control signal is transmitted via a power-over-Ethernet connection.

11. The power switching system according to claim 1 in which at least one of the power switching modules comprises a control output for connecting to the control input of another of the power switching modules for transmitting the control signal between the power switching modules.

12. The power switching system according to claim 1, comprising the electronic assembly.

13. The power switching system according to claim 12, in which a single power switching module is connected to each power supply unit.

14. The power switching system according to claim 12, in which the electronic assembly comprises a LED display screen and the plurality of electronic devices comprises a plurality of LED panels.

15. The power switching system according to claim 2, in which at least one of the power switching modules comprises a zero-crossing solid state relay configured to control power supply to the module power outlet or a negative temperature coefficient thermistor configured to control power supply to the module power output.

16. The power switching module for use in the power switching system of claim 1.

17. A method of controlling power supply to an electronic assembly comprising a plurality of electronic devices each having a power supply unit, the method comprising:

providing a plurality of power switching modules, each power switching module being configured to control power supply by a respective one of the power supply units to one of the electronic devices;

initiating at a delay module, a time delay for each power switching module, wherein each power switching module is configured, upon lapse of the time delay, to operate a switch to activate an electrical connection between the power switching module and the respective power supply unit and thereby to cause the power supply unit to switch on power supply to at least the respective one of the plurality of electronic devices;

wherein at least two of the time delays are of different durations, such that a duration of the time delay is different for at least two of the power switching modules and wherein the durations of at least two of the time delays are independent of each other.

18. The method of claim 17, in which either:

each power switching module comprises a delay module configured to initiate, upon receipt of a control signal by the control input, a time delay and the delay module being configured to operate the switch once the time delay has lapsed;

wherein at least two of the delay modules of the plurality of power switching modules are configured to initiate time delays of different durations, such that a duration of the time delay is different for at least two of the power switching modules, or;

a plurality of the power switching modules is connected to a single delay module and the delay module is configured to initiate a time delay for each power switching module to which it is connected and to transmit a control signal to each power switching module upon lapse of each time delay, to cause the power switching module to operate the switch.

19. The method of claim 17, in which the duration of each time delay is random.

20. The method of claim 17, comprising retrofitting the power switching modules to an existing electronic assembly.

* * * * *